US010224178B2

(12) United States Patent
Jung et al.

(10) Patent No.: US 10,224,178 B2
(45) Date of Patent: Mar. 5, 2019

(54) METHODS, SYSTEMS AND COMPUTER PROGRAM PRODUCTS CONFIGURED TO ADJUST A CRITICAL DIMENSION OF RETICLE PATTERNS USED TO FABRICATE SEMICONDUCTOR DEVICES

(71) Applicants: Yongseok Jung, Seoul (KR); Sungwon Kwon, Suwon-si (KR); Heebom Kim, Hwaseong-si (KR); Donggun Lee, Hwaseong-si (KR)

(72) Inventors: Yongseok Jung, Seoul (KR); Sungwon Kwon, Suwon-si (KR); Heebom Kim, Hwaseong-si (KR); Donggun Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 26 days.

(21) Appl. No.: 15/599,552

(22) Filed: May 19, 2017

(65) Prior Publication Data
US 2018/0082820 A1    Mar. 22, 2018

(30) Foreign Application Priority Data
Sep. 20, 2016   (KR) .......................... 10-2016-0120308

(51) Int. Cl.
| | | |
|---|---|---|
| G06F 17/50 | (2006.01) | |
| G03F 1/36 | (2012.01) | |
| H01J 37/302 | (2006.01) | |
| G01Q 30/06 | (2010.01) | |
| G03F 1/72 | (2012.01) | |

(52) U.S. Cl.
CPC .......... *H01J 37/3026* (2013.01); *G01Q 30/06* (2013.01); *G03F 1/36* (2013.01); *G03F 1/72* (2013.01); *G06F 17/5081* (2013.01); *G06F 17/50* (2013.01); *H01J 2237/31771* (2013.01); *H01J 2237/31776* (2013.01)

(58) Field of Classification Search
CPC ........ H01J 37/3026; G01Q 30/06; G03F 1/36; G03F 1/72; G06F 17/5081
USPC .......................................................... 716/50
See application file for complete search history.

(56) References Cited

U.S. PATENT DOCUMENTS

| | | | |
|---|---|---|---|
| 6,472,107 B1 | 10/2002 | Chan | |
| 6,974,651 B2 | 12/2005 | Choi | |
| 7,005,216 B2* | 2/2006 | Shiraishi | ................... G03F 1/56 430/5 |
| 7,323,080 B2 | 1/2008 | Kim et al. | |

(Continued)

FOREIGN PATENT DOCUMENTS

KR            101534832 B1    7/2015

*Primary Examiner* — Stacy Whitmore
(74) *Attorney, Agent, or Firm* — Ward and Smith, P.A.

(57) ABSTRACT

A method of adjusting a critical dimension of a reticle patterns in a reticle used to fabricate semiconductor devices can include determining respective values for a critical dimension of a plurality of reticle patterns in an image of the reticle and providing an atmospheric plasma to a first reticle pattern included in the plurality of reticle patterns, the first reticle pattern having a first value for the critical dimension that is different than a target value for the critical dimension. The atmospheric plasma may not be provided to second reticle patterns included in the plurality of reticle patterns, the second reticle patterns having a second value for the critical dimension that is about equal to the target value.

14 Claims, 11 Drawing Sheets

(56) References Cited

U.S. PATENT DOCUMENTS

| | | | |
|---|---|---|---|
| 7,972,469 B2* | 7/2011 | Hanawa | H01J 37/3266 |
| | | | 156/345.46 |
| 8,053,148 B2 | 11/2011 | Ryu | |
| 9,817,309 B2* | 11/2017 | Lee | G03F 1/74 |
| 2003/0059688 A1* | 3/2003 | Inomata | G03F 7/26 |
| | | | 430/5 |
| 2005/0015233 A1* | 1/2005 | Gordon | G03F 1/36 |
| | | | 703/13 |
| 2005/0136334 A1* | 6/2005 | Dierichs | G03F 1/54 |
| | | | 430/5 |
| 2005/0271951 A1 | 12/2005 | Kim | |
| 2007/0264584 A1* | 11/2007 | Kim | G03F 1/36 |
| | | | 430/5 |
| 2007/0298333 A1 | 12/2007 | Piumi et al. | |
| 2008/0257261 A1* | 10/2008 | Hanawa | H01J 37/32623 |
| | | | 118/719 |
| 2009/0053620 A1 | 2/2009 | Ha | |
| 2009/0286167 A1* | 11/2009 | Tan | G03F 1/50 |
| | | | 430/5 |
| 2010/0248094 A1* | 9/2010 | Stanton | G03F 1/72 |
| | | | 430/5 |
| 2011/0161893 A1* | 6/2011 | Lin | G03F 1/86 |
| | | | 716/52 |
| 2012/0282773 A1* | 11/2012 | Kamioka | H01L 21/76208 |
| | | | 438/689 |

* cited by examiner

METHODS, SYSTEMS AND COMPUTER PROGRAM PRODUCTS CONFIGURED TO ADJUST A CRITICAL DIMENSION OF RETICLE PATTERNS USED TO FABRICATE SEMICONDUCTOR DEVICES

CROSS-REFERENCE TO RELATED APPLICATIONS

This U.S. non-provisional patent application claims priority under 35 U.S.C. § 119 to Korean Patent Application No. 10-2016-0120308, filed on Sep. 20, 2016, in the Korean Intellectual Property Office, the entire content of which IS hereby incorporated herein by reference.

BACKGROUND

The present disclosure relates to the fabrication of a reticle to correct a critical dimension thereof.

In general, a process of fabricating a semiconductor device may include a plurality of unit processes including a thin-film deposition process, a photolithography process, and an etching process. The photolithography process can include an exposure process that is performed using an exposure system. The exposure system may include a reticle, in which metallic reticle patterns may be provided therein.

SUMMARY

Embodiments according to the inventive concept can provide methods, systems, and computer program products configured to adjust a critical dimension of reticle patterns used to fabricate semiconductor devices.

In some embodiments according to the inventive concept, a method of adjusting a critical dimension of a reticle patterns in a reticle used to fabricate semiconductor devices can include determining respective values for a critical dimension of a plurality of reticle patterns in an image of the reticle and providing an atmospheric plasma to a first reticle pattern included in the plurality of reticle patterns, the first reticle pattern having a first value for the critical dimension that is different than a target value for the critical dimension. The atmospheric plasma may not be provided to second reticle patterns included in the plurality of reticle patterns, the second reticle patterns having a second value for the critical dimension that is about equal to the target value.

In some embodiments according to the inventive concept, a method of correcting a critical dimension of a reticle pattern can include obtaining first critical dimensions of reticle patterns included in an image and locally providing plasma to the reticle patterns with the first critical dimensions to change at least one of the first critical dimensions to a second critical dimension.

In some embodiments according to the inventive concept, a method of fabricating a reticle can include forming a metal layer on a substrate and forming mask patterns on the metal layer. The metal layer can be etched using the mask patterns as an etch mask to form reticle patterns on the substrate. An image of the reticle patterns can be obtained along with the first critical dimensions of the reticle patterns in the image. A plasma can be locally provided to the reticle patterns with the first critical dimensions to change at least one of the first critical dimensions to a second critical dimension.

In some embodiments according to the inventive concept, a method of correcting a critical dimension of a reticle pattern can include obtaining a mean value of critical dimensions of reticle patterns in an image, where the critical dimensions correspond to distances between the reticle patterns in the image. The mean value can be compared to a target value and a thin layer can be locally applied to the reticle patterns to correct at least one of the critical dimensions, when the mean value is greater than the target value.

In some embodiments according to the inventive concept, a method of fabricating a semiconductor device, can include exposing light onto a semiconductor substrate using reticle patterns as an optical mask and forming semiconductor devices on the semiconductor substrate. An image of the reticle patterns can be obtained along with first critical dimensions of the reticle patterns in the image. A plasma can be locally provided to the reticle patterns with the first critical dimensions to change at least one of the first critical dimensions to a second critical dimension.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

As appreciated by the present inventors, in some embodiments according to the inventive concept, the critical dimension (CD) of reticle patterns used to fabricate a semiconductor device can be affected by various process parameters that (if unaddressed) can cause a failure in the process. Accordingly, in some embodiments, a CD of a reticle pattern can be adjusted using a local atmospheric plasma to etch local reticle patterns (to increase the CD) or form a layer on the reticle pattern (to decrease the CD). As appreciated by the present inventors, in some embodiments, the use of the local atmospheric plasma can limit the plasma to a local area of the substrate which is determined to have reticle patterns in need of correction (i.e., increase or decrease the CD) while leaving reticle patterns outside the local area substantially unchanged. In still other embodiments, different local adjustments to the CD can be provided to different areas of the reticle.

Figure 1:
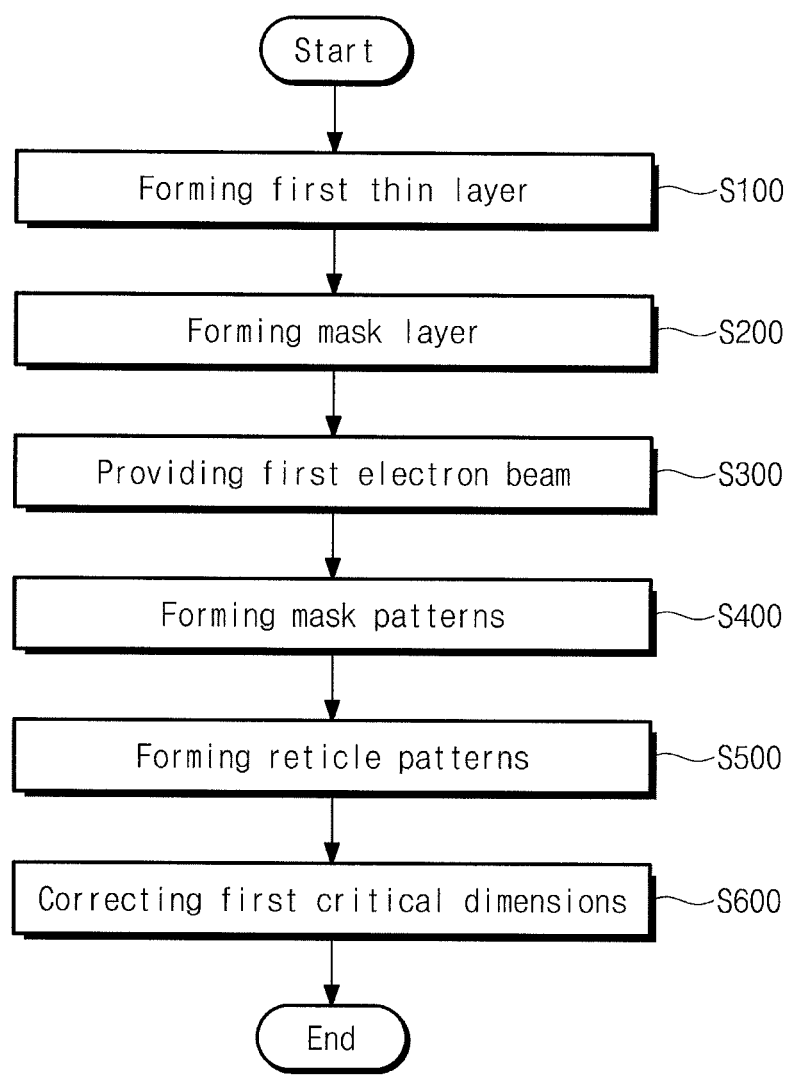
FIG. 1 is a flowchart illustrating a method of fabricating a reticle, according to some embodiments of the inventive concept.

The use of the FIG. 1 is a flowchart illustrating a method of fabricating a reticle, according to some embodiments of the inventive concept.

Referring to FIG. 1, a method of fabricating a reticle may include forming a first thin layer on a substrate (in S100), forming a mask layer (in S200), providing a first electron beam onto the mask layer (in S300), forming mask patterns (in S400), forming reticle patterns (in S500), and correcting first critical dimensions of the reticle patterns (in S600).

FIGS. 2 to 7 are sectional views sequentially illustrating process steps in the method of FIG. 1.

Figure 2:
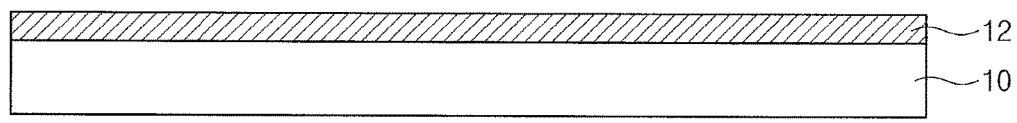
FIGS. 2 to 7 are sectional views sequentially illustrating process steps in the method of FIG. 1.

Referring to FIGS. 1 and 2, a first thin layer 12 may be formed on a substrate 10 (in S100). For example, the substrate 10 may be formed of or include a transparent glass or a silicon wafer. The first thin layer 12 may be formed by a physical vapor deposition method or a chemical vapor deposition method. The first thin layer 12 may be formed of or include a metal layer (e.g., a chromium or nickel layer). In certain embodiments, the first thin layer 12 may be formed of or include a dielectric material (e.g., silicon oxide or silicon nitride).

Figure 3:
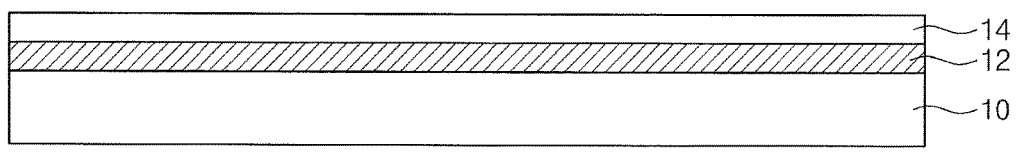

Referring to FIGS. 1 and 3, a mask layer 14 may be formed on the first thin layer 12 (in S200). The mask layer 14 may include a photoresist material.

Figure 4:
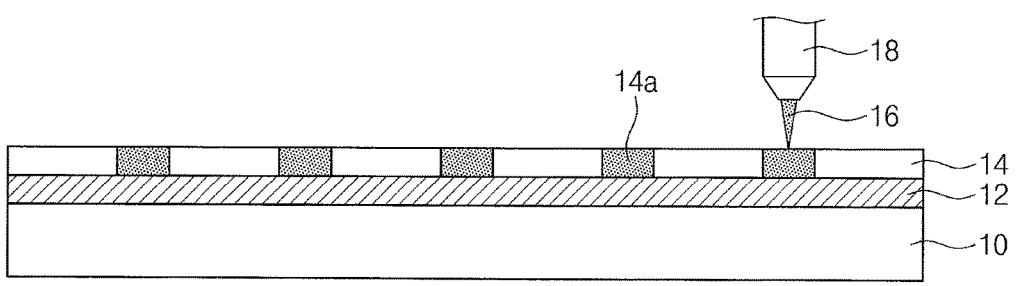
Figure 8:
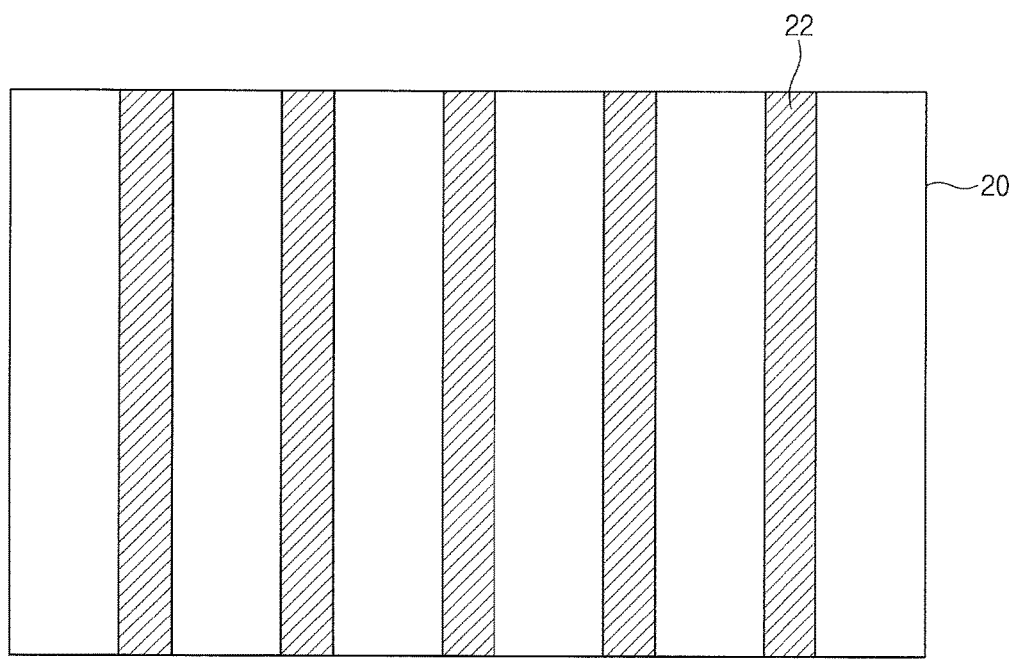
FIG. 8 is a plan view illustrating a reference map for an electron beam to be provided onto a mask layer of FIG. 4.

FIG. 8 illustrates an example of a reference map 20 for a first electron beam 16 to be provided onto the mask layer 14 of FIG. 4.

Referring to FIGS. 1, 4, and 8, the first electron beam 16 may be provided onto the mask layer 14 (in S300). For example, an electron beam exposure system 18 may be used to partially provide the first electron beam 16 onto the mask layer 14. The providing of the first electron beam 16 onto the mask layer 14 may be performed according to reference patterns 22 in the reference map 20. The providing of the first electron beam 16 may lead to a change in physical and chemical characteristics of the exposed portions of the mask layer 14a. The reference map 20 may include, for example, a target map or an etch proximity correction map. The etch proximity correction map may be obtained by correcting the target map in consideration of an etch proximity effect.

Figure 5:
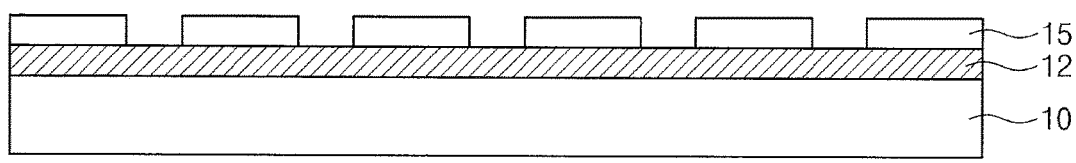

Referring to FIGS. 1 and 5, mask patterns 15 may be formed (in S400). The mask patterns 15 may be formed by performing a development process on the mask layer 14. In some embodiments, the exposed portion of the mask layer 14a may be removed after the formation of the mask patterns 15. The mask patterns 15 may be formed to partially expose the first thin layer 12.

Figure 6:
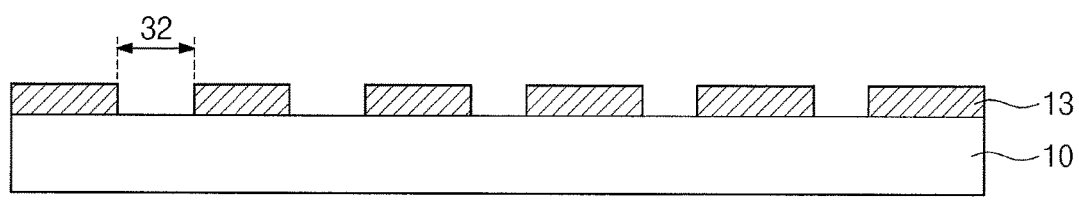

Referring to FIGS. 1 and 6, reticle patterns 13 may be formed by etching the exposed portions of the first thin layer 12 (in S500). The etching of the first thin layer 12 may include an anisotropic dry etching manner. Thereafter, the mask patterns 15 may be removed. The reticle patterns 13 may be formed to have first critical dimensions 32. For example, each of the first critical dimensions 32 may have a bright field critical dimension and/or a dark field critical dimension. The bright field critical dimension may be a critical dimension of a clear pattern. As an example, the bright field critical dimension may correspond to a distance between adjacent ones of the reticle patterns 13. The dark field critical dimension may correspond to a width of each of the reticle patterns 13. Hereinafter, for the sake of simplicity, the description that follows will refer to an example in which the first critical dimension 32 is the bright field critical dimension, but embodiments according to the inventive concept are not limited thereto.

The reticle patterns 13 may define a spatial distribution in intensity of light to be provided onto a semiconductor substrate. The light to be provided onto the semiconductor substrate may be used to fabricate semiconductor devices on the semiconductor substrate. If there is a failure in a process of fabricating the semiconductor devices, the reticle patterns 13 may be corrected, based on the critical dimension of the semiconductor device.

Figure 9:
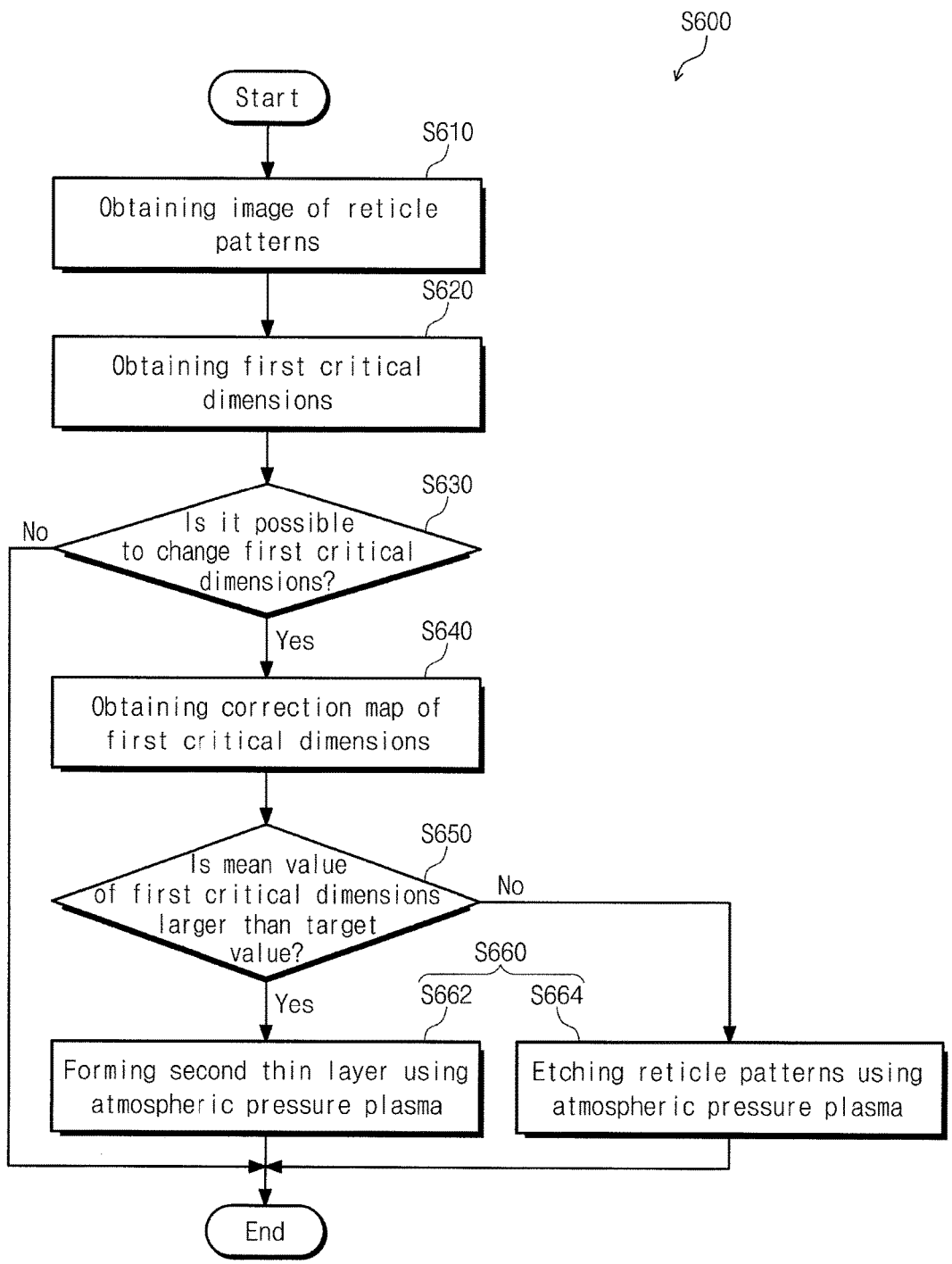
FIG. 9 is a flowchart illustrating an example of a step of correcting critical dimensions of reticle patterns of FIG. 1.

FIG. 9 is a flowchart illustrating an example of the step S600 of correcting critical dimensions of the reticle patterns 13 of FIG. 1.

Figure 7:
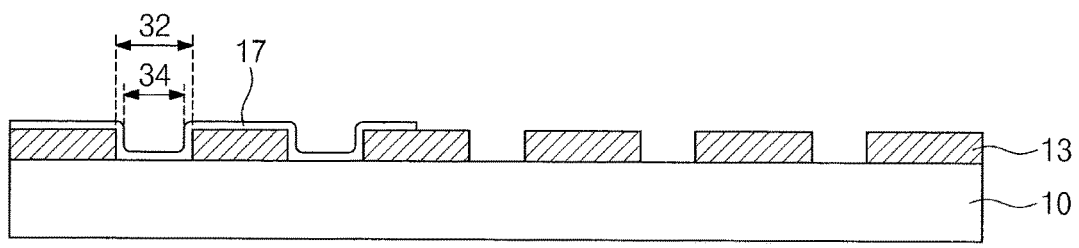

Referring to FIGS. 1, 7, and 9, the reticle patterns 13 may be corrected to have second critical dimensions 34 (in S600). In some embodiments, the first critical dimensions 32 may be different from the second critical dimensions 34. Each of the second critical dimensions 34 may correspond to a predetermined target value. Each of the second critical dimensions 34 may be less than a corresponding one of the first critical dimensions 32. In certain embodiments, each of the second critical dimensions 34 may be larger than a corresponding one of the first critical dimensions 32. In the case where the first critical dimensions 32 is equal to the second critical dimensions 34, the step S600 may be omitted.

Referring to FIG. 7, an atmospheric pressure plasma method may be used to correct the reticle patterns 13 from the first critical dimensions 32 to the second critical dimensions 34. For example, the atmospheric pressure plasma method may be performed to locally form a second thin layer 17 on the reticle patterns 13 and the substrate 10. The second critical dimensions 34 may correspond to a distance between facing surfaces of the second thin layer 17 that is formed on opposite sidewalls of the reticle patterns 13. The second critical dimensions 34 may be less than the first critical dimensions 32. The second thin layer 17 may be formed of or include, for example, a silicon oxide layer. In some embodiments, the reticle patterns 13 and the second thin layer 17 may be used and/or treated as a reticle for a large display device, an ArF excimer laser system, and an extreme ultraviolet (EUV) exposure system. For example, during a patterning process for fabricating a semiconductor device, the reticle patterns 13 and the second thin layer 17 may be used to determine a spatial distribution in projection intensity of light provided from a light source (e.g., ArF excimer laser or EUV). As shown in FIG. 7, in some embodiments, the local use of an atmospheric plasma may allow the CD of the reticle patterns 13 located inside a particular area of the substrate to be adjusted while leaving the CD of the reticle patterns 13 located outside the particular area substantially unchanged so that a difference between the CDs of both the reticle patterns 13 located inside and outside the local area can be reduced.

The reticle patterns 13 may be etched using an atmospheric pressure plasma. This may lead to an increase in distance between the reticle patterns 13 compared to when the reticle is etched without using and atmospheric pressure plasma. The second critical dimensions 34 may correspond to a distance between the etched reticle patterns 13. In this case, each of the second critical dimensions 34 may be larger than a corresponding one of the first critical dimensions 32.

Referring to FIG. 9, the step S600 may include obtaining an image of the reticle patterns 13 (in S610), obtaining the first critical dimensions 32 (in S620), determining whether it is possible to change the first critical dimensions 32 (in S630), obtaining a correction map of the first critical dimensions 32 (in S640), comparing a mean value of the first critical dimensions 32 with a target value (in S650), and providing atmospheric pressure plasma (in S660).

Figure 10:
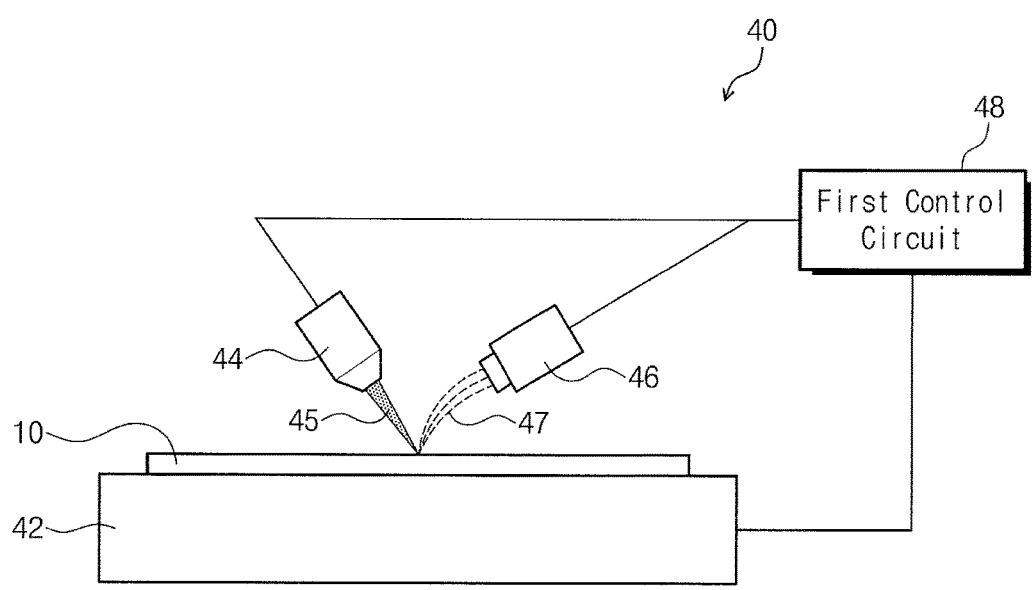
FIG. 10 is a diagram illustrating an example of a measurement system for measuring reticle patterns of FIG. 6.
Figure 11:
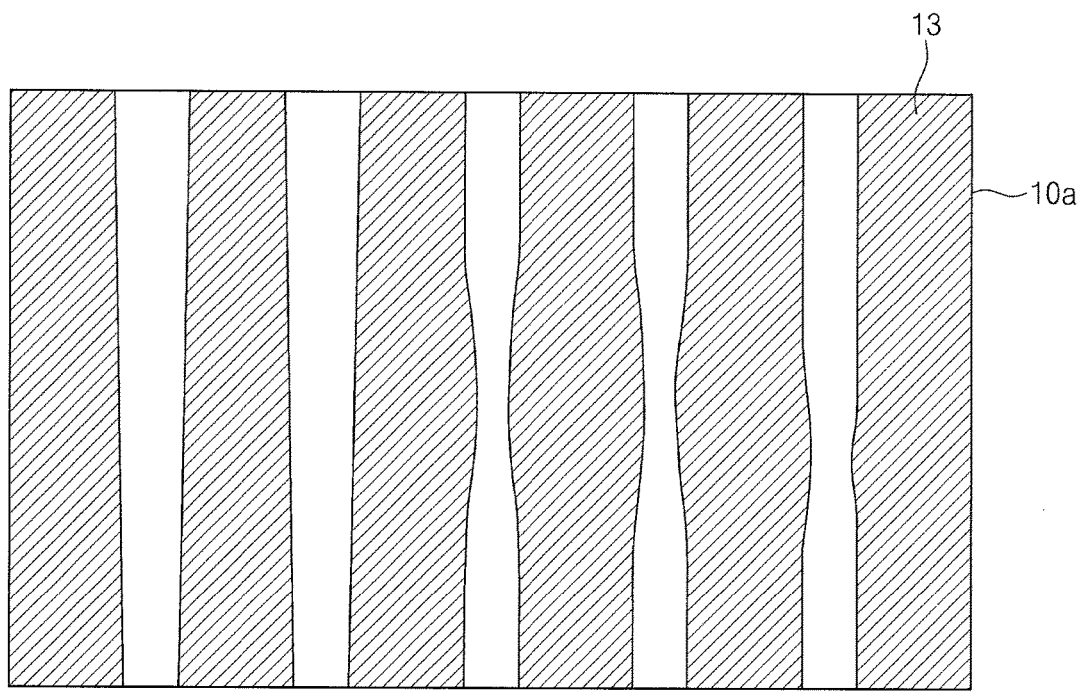
FIG. 11 is a diagram schematically illustrating a reticle pattern image obtained using the measurement system of FIG. 10.

FIG. 10 illustrates an example of a measurement system 40 for measuring the reticle patterns 13 of FIG. 6. FIG. 11 illustrates an example of an image 10a of the reticle patterns 13 that may be obtained using the measurement system 40 of FIG. 10.

Referring to FIGS. 9 to 11, the measurement system 40 may be configured to measure the reticle patterns 13 and obtain the image 10a of the reticle patterns 13 (in S610). For example, the measurement system 40 may include an electron microscope or an optical microscope. In some embodiments, the measurement system 40 may include a first stage 42, an electron gun 44, a detector 46, and a first control circuit 48. The first stage 42 may be configured to load the substrate 10 thereon. The first stage 42 may also be configured to move the substrate 10 relative to the electron gun 44 and the detector 46. The electron gun 44 may be configured to provide a second electron beam 45 onto the substrate 10. The second electron beam 45 may be used to produce secondary electrons 47 from the substrate 10 and the reticle patterns 13. The detector 46 may be configured to detect the secondary electrons 47. The first control circuit 48 may be configured to obtain the image 10a of the substrate 10 and the reticle patterns 13, from detection signals of the secondary electrons 47.

Figure 12:
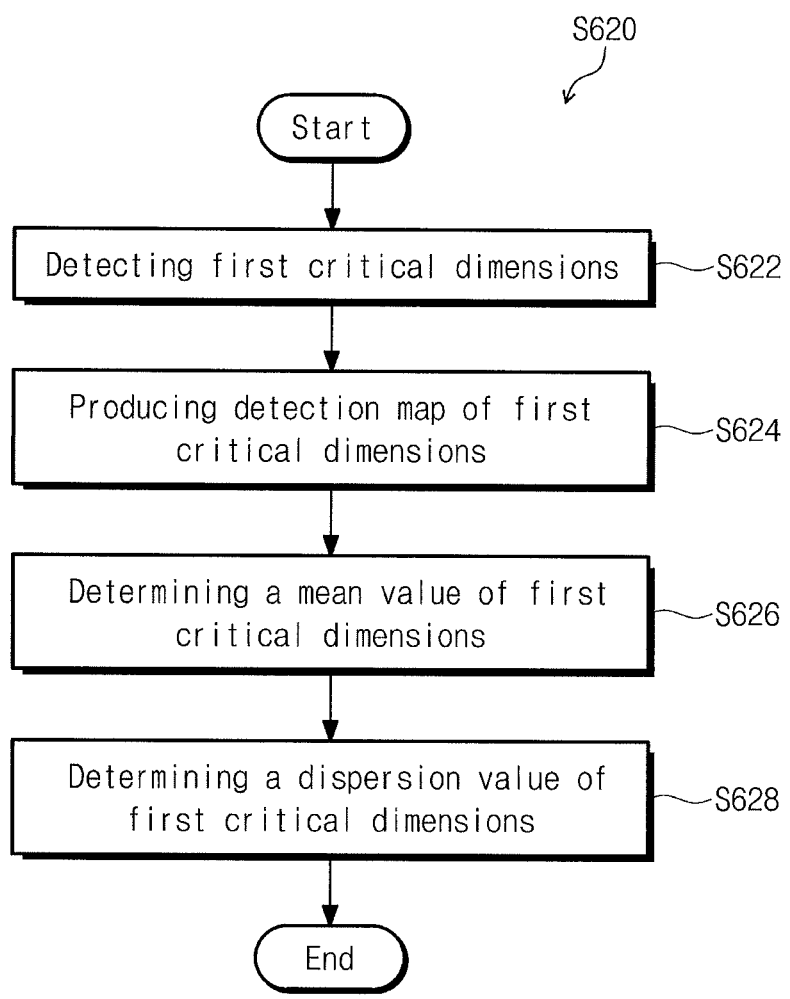
FIG. 12 is a flowchart illustrating an example of a step of obtaining first critical dimensions of FIG. 9.

FIG. 12 illustrates an example of the step S620 of obtaining the first critical dimensions 32 of FIG. 9.

Referring to FIGS. 9 to 12, the first control circuit 48 may be used to obtain the first critical dimensions 32 of the reticle patterns 13 in the image 10a (in S620). In some embodiments, the obtaining of the first critical dimensions 32 (in S620) may include measuring or detecting the first critical dimensions 32 (in S622), producing a detection map of the first critical dimensions 32 (in S624), determining a mean value of the first critical dimensions 32 (in S626), and determining a variation or dispersion value of the first critical dimensions 32 (in S628).

Referring to FIGS. 10 and 12, the first control circuit 48 may be used to measure or detect the first critical dimensions 32 of the reticle patterns 13 in the image 10a (in S622). Each of the first critical dimensions 32 may be a number which corresponds to a distance between the reticle patterns 13 and can be determined by the step S622.

Figure 13:
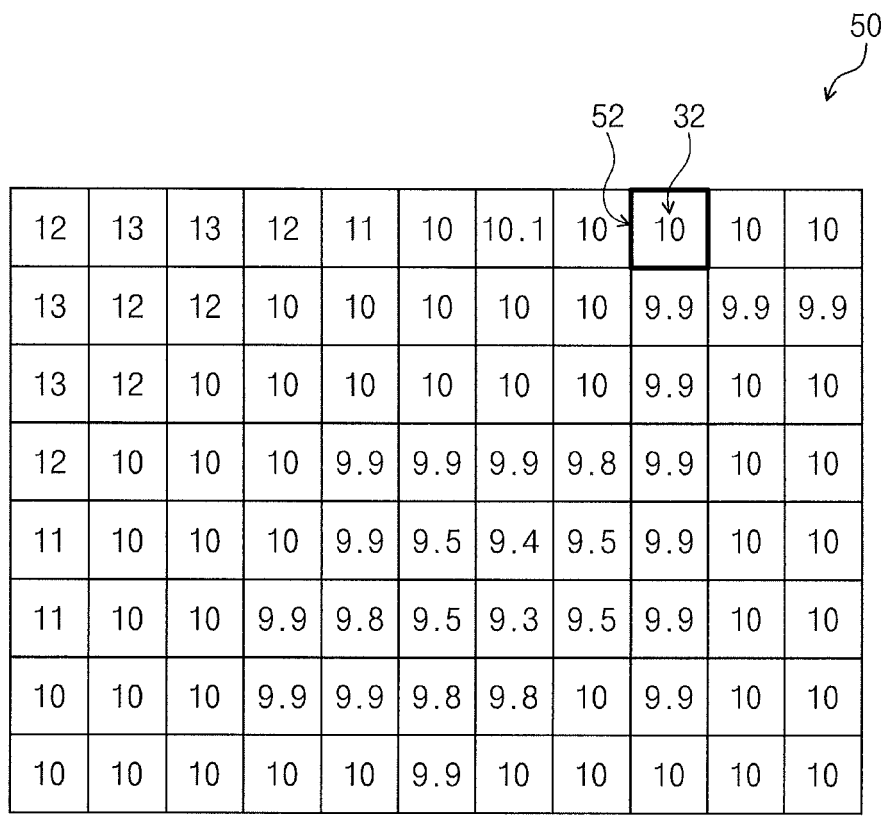
FIG. 13 is an example of a detection map containing information on first critical dimensions of reticle patterns in the image of FIG. 11.

FIG. 13 illustrates an example of a detection map 50 containing information on the first critical dimensions 32 of the reticle patterns 13 in the image 10a of FIG. 11.

Referring to FIGS. 10, 12, and 13, the first control circuit 48 may be used to produce the detection map 50 of the first critical dimensions 32 (in S624). The detection map 50 may include a plurality of first cells 52. For example, the number of the first cells 52 included in the detection map 50 may be 88. In certain embodiments, the number of the first cells 52 included in the detection map 50 may be 640×480, 1280× 720, 1920×1080, 3840×2160, 4096×2160, or 7680×4320.

Furthermore, the first cells 52 may have the first critical dimensions 32, respectively. In some embodiments, within each of the first cells 52, the first critical dimension 32 may be represented as a numeric value. In other words, the numeric values within the first cells 52 may correspond to the first critical dimensions 32. For example, the first cells 52 may have the first critical dimensions 32 ranging from about 9.3 nm to about 13 nm.

Thereafter, the first control circuit 48 may be used to determine a mean value of the first critical dimensions 32 (in S626). In some embodiments, the mean value of the first critical dimensions 32 may be a value that is obtained by dividing a sum of the first critical dimensions 32 in the detection map 50 by the number of the first cells 52. For example, the mean value of the first critical dimensions 32 in the detection map 50 may be about 10.24.

The first control circuit 48 may be used to determine a dispersion value of the first critical dimensions 32 (in S628). In some embodiments, the dispersion value of the first critical dimensions 32 may be calculated using a 3-sigma method. For example, the dispersion value of the first critical dimensions 32 may be 2.49. The dispersion value of the first critical dimensions 32 may correspond to uniformity of the first critical dimensions 32. In certain embodiments, the uniformity of the first critical dimensions 32 may be given as a reciprocal number of the dispersion value of the first critical dimensions 32.

Referring back to FIGS. 9 and 10, the first control circuit 48 may also be used to determine whether it is possible to correct the first critical dimensions 32 (in S630). The possibility of the correction of the first critical dimensions 32 may be determined by the dispersion value of the first critical dimensions 32. In the case where the dispersion value of the first critical dimensions 32 is less than 3, it may be possible to correct the first critical dimensions 32. Here, the value of 3 may be a value that is obtained in an empirical manner. By contrast, in the case where the uniformity of the first critical dimensions 32 is greater than 3, there may be a difficulty in correcting the first critical dimensions 32. That is, in the case where a difference between the first and second critical dimensions 32 and 34 is excessively large, there may be a difficulty in correcting the first critical dimensions 32.

Figure 14:
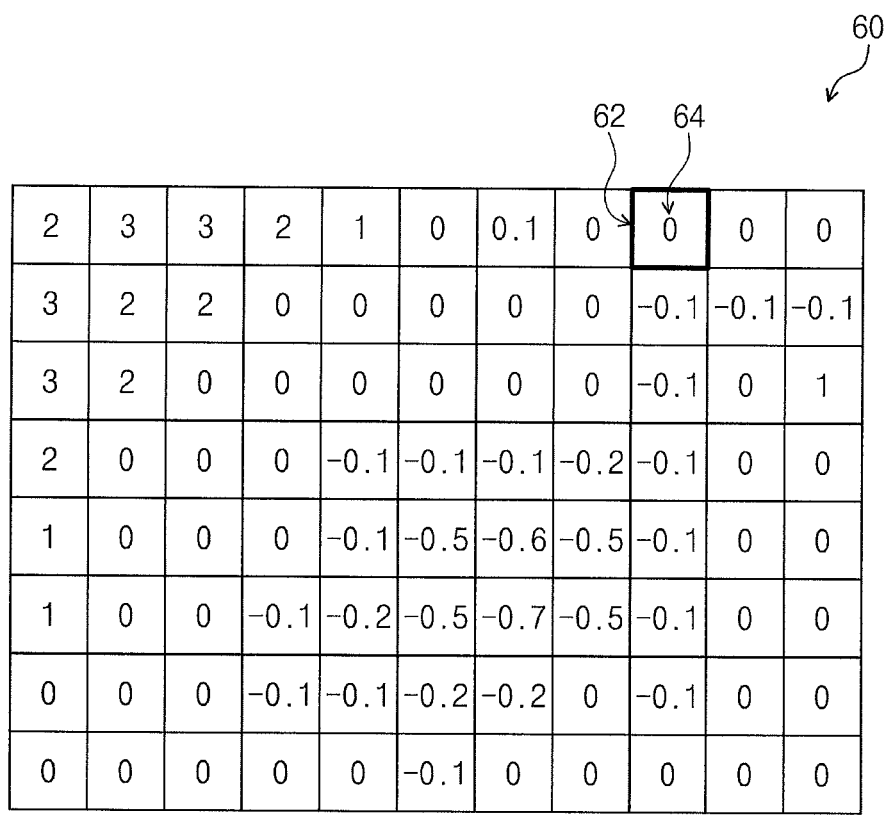
FIG. 14 is an example of a correction map produced from the detection map of FIG. 13.

FIG. 14 illustrates a correction map 60 produced from the detection map 50 of FIG. 13.

The first control circuit 48 may be used to produce the correction map 60 of the first critical dimensions 32 (in S640). In some embodiments, the correction map 60 may be produced from the detection map 50. The correction map 60 may include a plurality of second cells 62. The second cells 62 may correspond to the first cells 52. The second cells 62 of the correction map 60 may have difference values 64 representing differences between a target value and the first critical dimensions 32. In some embodiments, the difference values 64 may be correction values that are used to change the first critical dimensions 32 to the second critical dimensions 34. For example, when the target value is 10 nm, the difference values 64 of the second cells 62 may range from −0.7 nm to 3 nm.

Thereafter, the first control circuit 48 may be used to compare a mean value of the first critical dimensions 32 to a target value and to determine the use of an atmospheric pressure plasma, based on the comparison result (in S650). The atmospheric pressure plasma method may include, for example, a thin-film deposition process or an etching process. In certain cases, the mean value and the target value may be the same. In some embodiments, even if the mean value and the target value are the same, one of the thin-film deposition process and the etching process may be performed as the atmospheric pressure plasma method, under the control of the first control circuit 48. The thin-film deposition process or the etching process may be performed, based on the correction map 60. In the case where the mean value and the target value are different from each other, the first control circuit 48 may be used to select one of a thin-film deposition process and an etching process on the reticle patterns 13. The thin-film deposition process or the etching process on the reticle patterns 13 may be performed based on the comparison between the mean and target values.

Figure 15:
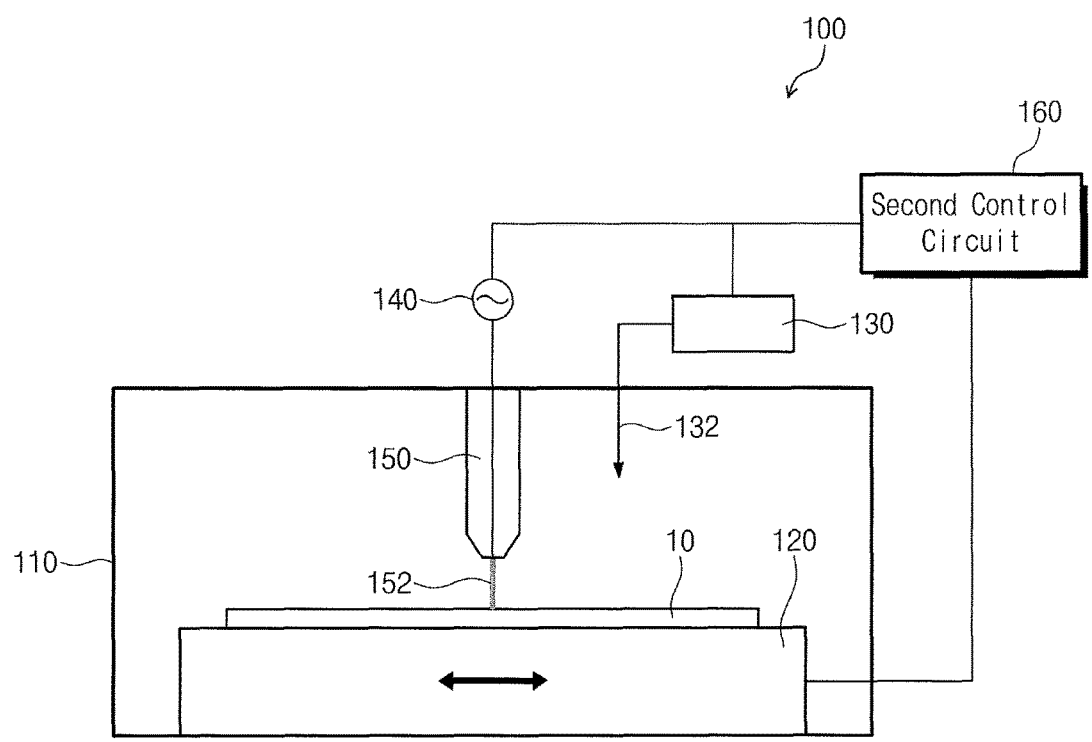
FIG. 15 is a diagram illustrating an atmospheric pressure plasma system that is configured to produce atmospheric pressure plasma according to the correction map of FIG. 14.

FIG. 15 illustrates an example of an atmospheric pressure plasma system 100, which is configured to provide atmospheric pressure plasma 152 according to the correction map 60 of FIG. 14.

Referring to FIGS. 9 and 15, the atmospheric pressure plasma system 100 may be configured to provide the atmospheric pressure plasma 152 onto the reticle patterns 13 and/or the substrate 10 according to the correction map 60 (in S660).

For example, the atmospheric pressure plasma system 100 may be configured to locally provide the atmospheric pressure plasma 152. In some embodiments, the atmospheric pressure plasma system 100 may include a chamber 110, a second stage 120, a reaction gas supplying unit 130, a radio frequency supplying unit 140, a plasma gun 150, and a second control circuit 160. The chamber 110 may be configured to provide an isolated space for the substrate 10. The second stage 120 may be disposed in the chamber 110. The second stage 120 may be configured to load the substrate 10 thereon. The second stage 120 may also be configured to move the substrate 10 relative to the plasma gun 150. The reaction gas supplying unit 130 may be configured to supply a reaction gas 132 into the chamber 110. The reaction gas 132 may contain He, $N_2$, $O_2$, $SiH_4$, $Cl_2$, $CF_4$, $SF_6$, or $CHF_3$. The radio frequency supplying unit 140 may be configured to supply radio frequency power to the plasma gun 150. For example, the radio frequency power may range from about 30 W to about 450 W. The plasma gun 150 may be configured to locally form the atmospheric pressure plasma 152 on the substrate 10. The plasma gun 150 may include a radio frequency electrode. The second control circuit 160 may be used to control the second stage 120, the reaction gas supplying unit 130, the radio frequency supplying unit 140, and the plasma gun 150. The thin-film deposition process and/or the etching process may be performed using the atmospheric pressure plasma 152. In certain embodiments, the atmospheric pressure plasma system 100 may be replaced with a remote plasma system or a vacuum plasma system. For example, the atmospheric pressure plasma 152 may be remote plasma.

Referring to FIG. 9, providing of the atmospheric pressure plasma 152 (in S660) may include forming the second thin layer 17 (in S662) and etching the reticle patterns 13 (in S664).

Referring to FIGS. 7, 9, and 15, in the case where the mean value is larger than the target value, the atmospheric pressure plasma system 100 may be used to locally form the second thin layer 17 on the substrate 10 and the reticle patterns 13, based on the correction map 60 (in S662). For example, the reaction gas supplying unit 130 may supply He and $SiH_4$ into the chamber 110. The atmospheric pressure plasma 152 may be used to locally form the second thin layer 17 on the reticle patterns 13. The second thin layer 17 may be used to change the first critical dimension 32 of at least one of the reticle patterns 13 to the second critical dimension 34. The second critical dimensions 34 may be less than at least one of the first critical dimensions 32. The second critical dimensions 34 may be determined by a thickness of the second thin layer 17. The thickness of the second thin layer 17 may be changed depending on a movement speed of the second stage 120. For example, if the second stage 120 and the substrate 10 are moved at a low speed, the second thin layer 17 formed by the atmospheric pressure plasma 152 may have a relatively large thickness. In this case, a difference between the first and second critical dimensions 32 and 34 may be relatively increased. By contrast, in the case where the second stage 120 is moved at a high speed, the second thin layer 17 may have a relatively small thickness. In this case, a difference between the first and second critical dimensions 32 and 34 may be relatively decreased. That is, the plasma system 100 may be used to control a thickness of the second thin layer 17 and thereby to correct the first critical dimensions 32 to the second critical dimensions 34.

By contrast, in the case where the mean value is less than the target value, the atmospheric pressure plasma system 100 may be used to etch the reticle patterns 13, based on the correction map 60 (in S664). For example, the reaction gas supplying unit 130 may supply He, $N_2$, $O_2$, $Cl_2$, $CF_4$, $SF_6$, or $CHF_3$ into the chamber 110. The atmospheric pressure plasma 152 may be used to locally etch the reticle patterns 13. As a result of the etching process, the reticle patterns 13 may have the second critical dimension 34. Each of the second critical dimensions 34 may be larger than a corresponding one of the first critical dimensions 32. The second critical dimensions 34 may be determined according to an etching amount of the reticle patterns 13. For example, in the case where the second stage 120 and the substrate 10 are moved at a low speed, an etching amount of the reticle patterns 13 may be increased. Accordingly, a distance between the reticle patterns 13 may be increased. In other words, a difference between the first and second critical dimensions 32 and 34 of the reticle patterns 13 may be relatively increased. In the case where the second stage 120 is moved at a high speed, the etching amount of the reticle patterns 13 may be decreased. Accordingly, the distance between the reticle patterns 13 may be increased by a lesser amount, and thus, a difference between the first and second critical dimensions 32 and 34 may be relatively decreased. That is, the plasma system 100 may be used to control an etching amount of the reticle patterns 13 and thereby to correct the first critical dimensions 32 to the second critical dimensions 34.

In the case where the mean value is the same as the target value, the providing of the atmospheric pressure plasma 152 (in S660) may further include performing one of a thin-film deposition process and an etching process, based on the correction map 60, and the atmospheric pressure plasma system 100 may be used for such a process.

According to some embodiments of the inventive concept, a method of correcting a critical dimension of a reticle pattern may include locally providing plasma onto at least one of reticle patterns whose critical dimensions are first critical dimensions. The use of the plasma may make it possible to allow at least one of the reticle patterns to have a critical dimension that is different from the first critical dimension thereof. For example, the use of the plasma may allow the reticle pattern to have a second critical dimension different from the first critical dimension. Here, the second critical dimension may be less or larger than the first critical dimension.

Example embodiments are described herein with reference to block diagrams and/or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

Computer program code for carrying out operations for aspects of the present disclosure may be written in any combination of one or more programming languages, including an object oriented programming language such as Java, Scala, Smalltalk, Eiffel, JADE, Emerald, $C_{++}$, C#, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computer environment or offered as a service such as a Software as a Service (SaaS).

These computer program instructions may also be stored in a tangible computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/BlueRay).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks. Accordingly, embodiments of the present inventive concepts may be embodied in hardware and/or in software (including firmware, resident software, micro-code, etc.) that runs on a processor such as a digital signal processor, which may collectively be referred to as "circuitry," "a module," or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated. Moreover, although some of the diagrams include arrows on communication paths to show a primary direction of communication, it is to be understood that communication may occur in the opposite direction to the depicted arrows.

While example embodiments of the inventive concepts have been particularly shown and described, it will be understood by one of ordinary skill in the art that variations in form and detail may be made therein without departing from the spirit and scope of the attached claims.

What is claimed:

1. A method of correcting a critical dimension of reticle patterns, comprising:
    obtaining an image of the reticle patterns;
    obtaining first critical dimensions of the reticle patterns in the image, wherein obtaining the first critical dimensions comprises detecting the first critical dimensions and determining a mean value of the first critical dimensions;
    obtaining a detection map of the first critical dimensions;
    comparing the mean value of the first critical dimensions with a target value corresponding to a second critical dimension;
    obtaining a correction map that comprises difference values between the first critical dimensions in the detection map and the target value; and
    locally providing plasma to the reticle patterns with the first critical dimensions to change at least one of the first critical dimensions to the second critical dimension,
    wherein locally providing plasma to the reticle patterns comprises independently providing a plasma gun to generate plasma to selectively form a thin layer on the reticle patterns at each position on a substrate corresponding to cells when the mean value is greater than the target value based on the correction map.

2. The method of claim 1, wherein the thin layer comprises a silicon oxide layer, and
    each second critical dimension corresponds to a distance between facing surfaces of the silicon oxide layer formed on opposite sidewalls of the reticle patterns.

3. The method of claim 1, wherein locally providing the plasma comprises etching the reticle patterns based on the correction map, when the mean value is less than the target value to provide etched reticle patterns, and
    each second critical dimension corresponds to a distance between the etched reticle patterns.

4. The method of claim 1, wherein obtaining the first critical dimensions further comprises calculating a dispersion value of the first critical dimensions, and the method further comprises determining whether to correct the first critical dimensions, based on the dispersion value.

5. The method of claim 1, wherein the plasma comprises atmospheric pressure plasma or remote plasma.

6. The method of claim 1, wherein each of the first critical dimensions comprises a bright field critical dimension corresponding to a distance between the reticle patterns.

7. A method of fabricating a reticle, comprising:
forming a thin layer on a substrate;
forming mask patterns on the thin layer;
etching the thin layer using the mask patterns as an etch mask to form reticle patterns on the substrate;
obtaining an image of the reticle patterns;
obtaining first critical dimensions of the reticle patterns in the image, wherein obtaining the first critical dimensions comprises detecting the first critical dimensions and determining a mean value of the first critical dimensions;
obtaining a detection map of the first critical dimensions;
comparing values of the first critical dimensions with a target value corresponding to a second critical dimension;
obtaining a correction map that comprises difference values between the first critical dimensions of the reticle patterns in the detection map and the target value; and
locally providing plasma to the reticle patterns with the first critical dimensions to change at least one of the first critical dimensions to the second critical dimension,
wherein locally providing plasma to the reticle patterns comprises independently providing a plasma gun to generate plasma to selectively form a thin layer on the reticle patterns at each position on the substrate corresponding to cells when the mean value is greater than the target value based on the correction map.

8. The method of claim 7, wherein the mask patterns are formed according to a reference map.

9. The method of claim 7, wherein locally providing the plasma comprises providing an atmospheric pressure plasma on the reticle patterns.

10. The method of claim 7, wherein obtaining the mean value of the first critical dimensions further comprises:
determining a dispersion value of the first critical dimensions; and
determining whether to correct the first critical dimensions, based on the dispersion value.

11. The method of claim 7, wherein the thin layer is a metal layer.

12. A method of correcting a critical dimension of a reticle pattern, comprising:
obtaining a mean value of critical dimensions of a reticle pattern in an image, wherein obtaining the mean value of critical dimensions comprises obtaining a detection map of critical dimensions of the reticle pattern, and wherein the critical dimensions of the reticle pattern correspond to distances between reticle patterns in the image;
comparing the mean value of critical dimensions with a target value;
obtaining a correction map comprising difference values between critical dimensions in the detection map and the target value; and
locally depositing a thin layer on the reticle pattern to correct at least one of the critical dimensions, when the mean value of critical dimensions is greater than the target value,
wherein locally depositing the thin layer on the reticle pattern comprises independently providing a plasma gun to locally generate plasma to selectively form the thin layer on the reticle pattern at each position on a substrate corresponding to cells when the mean value of critical dimensions is greater than the target value based on the correction map.

13. The method of claim 12, wherein locally depositing the thin layer comprises providing an atmospheric pressure plasma on the reticle pattern to form the thin layer on the reticle pattern.

14. The method of claim 12, further comprising:
etching the reticle pattern based on the correction map, when the mean value of the critical dimensions is less than the target value.

\* \* \* \* \*